(12) United States Patent
Wang et al.

(10) Patent No.: US 11,056,486 B2
(45) Date of Patent: Jul. 6, 2021

(54) SEMICONDUCTOR DEVICE WITH MULTIPLE THRESHOLD VOLTAGE AND METHOD OF FABRICATING THE SAME

(71) Applicant: TAIWAN SEMICONDUCTOR MANUFACTURING CO., LTD., Hsinchu (TW)

(72) Inventors: Li-Ting Wang, Hsinchu (TW); Teng-Chun Tsai, Hsinchu (TW); Cheng-Tung Lin, Jhudong Township (TW); De-Fang Chen, Hsinchu (TW); Hui-Cheng Chang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/368,827

(22) Filed: Mar. 28, 2019

(65) Prior Publication Data
US 2019/0229118 A1    Jul. 25, 2019

Related U.S. Application Data

(63) Continuation of application No. 14/148,825, filed on Jan. 7, 2014, now Pat. No. 10,276,562.

(51) Int. Cl.
*H01L 27/088* (2006.01)
*H01L 29/78* (2006.01)
(Continued)

(52) U.S. Cl.
CPC ...... *H01L 27/088* (2013.01); *H01L 21/26586* (2013.01); *H01L 21/823412* (2013.01);
(Continued)

(58) Field of Classification Search
CPC ............. H01L 27/088; H01L 29/42392; H01L 29/66666; H01L 29/7827; H01L 21/26586;
(Continued)

(56) References Cited

U.S. PATENT DOCUMENTS 6,087,248 A    7/2000 Rodder
8,749,046 B2 *  6/2014 Kodani ............ H01L 23/49811
                                              257/690
(Continued)

FOREIGN PATENT DOCUMENTS

CN    102024813 A    4/2011
CN    102280479 A   12/2011

OTHER PUBLICATIONS

Taiwan Office Action; Application No. 103146023; dated Sep. 6, 2016.
(Continued)

*Primary Examiner* — Nathan W Ha
(74) *Attorney, Agent, or Firm* — McDermott Will & Emery LLP

(57) ABSTRACT

A semiconductor device includes a first vertical device having a first threshold and second vertical device having a second threshold. The first vertical device includes a first source; a first channel over the first source; a first drain over the first channel; a first conductive layer adjacent to the first channel; and a first gate adjacent to the first conductive layer. The second vertical device includes a second source; a second channel over the second source; a second drain over the second channel; a second conductive layer adjacent to the second channel; and a second gate adjacent to the second conductive layer.

20 Claims, 19 Drawing Sheets

100

(51) Int. Cl.
*H01L 21/8234* (2006.01)
*H01L 21/265* (2006.01)
*H01L 29/423* (2006.01)
*H01L 29/66* (2006.01)

(52) U.S. Cl.
CPC ........... *H01L 21/823418* (2013.01); *H01L 21/823437* (2013.01); *H01L 21/823487* (2013.01); *H01L 29/42392* (2013.01); *H01L 29/66666* (2013.01); *H01L 29/7827* (2013.01)

(58) Field of Classification Search
CPC ..... H01L 21/823412; H01L 21/823418; H01L 21/823437; H01L 21/823487
See application file for complete search history.

(56) References Cited

U.S. PATENT DOCUMENTS

| | | |
|---|---|---|
| 2002/0084493 A1 | 7/2002 | Marshall et al. |
| 2005/0282326 A1 | 12/2005 | Gilmer et al. |
| 2006/0001162 A1 | 1/2006 | Schutz et al. |
| 2006/0006476 A1 | 1/2006 | Biery et al. |
| 2007/0184627 A1 | 8/2007 | Cho et al. |
| 2007/0212896 A1 | 9/2007 | Olsen et al. |
| 2007/0298599 A1 | 12/2007 | Jang et al. |
| 2009/0134465 A1 | 5/2009 | Shimizu |
| 2010/0059807 A1 | 3/2010 | Cho et al. |
| 2011/0086477 A1 | 4/2011 | Ohuchi |
| 2011/0169074 A1* | 7/2011 | Lee ............... H01L 29/66666 257/329 |
| 2011/0175152 A1 | 7/2011 | Booth, Jr. et al. |
| 2011/0187407 A1 | 8/2011 | Iyer et al. |
| 2011/0233688 A1 | 9/2011 | Ren et al. |
| 2011/0284966 A1* | 11/2011 | Wen ............... H01L 21/823456 257/368 |
| 2011/0299325 A1 | 12/2011 | Kim |
| 2011/0303985 A1 | 12/2011 | Masuoka et al. |
| 2012/0108017 A1 | 5/2012 | Greene et al. |
| 2012/0132912 A1 | 5/2012 | Suekawa et al. |
| 2012/0132998 A1* | 5/2012 | Kwon ............... H01L 21/82345 257/369 |
| 2013/0062673 A1 | 3/2013 | Masuoka et al. |
| 2013/0113027 A1* | 5/2013 | Chiang ............... H01L 29/518 257/288 |
| 2013/0240996 A1 | 9/2013 | Yin et al. |
| 2013/0299771 A1* | 11/2013 | Youn ............... H01L 21/845 257/9 |
| 2014/0027857 A1* | 1/2014 | Yin ............... H01L 27/088 257/368 |
| 2014/0252487 A1* | 9/2014 | Stephens ............... H01L 27/092 257/368 |
| 2014/0264483 A1* | 9/2014 | Yoshida ............... H01L 21/28079 257/288 |
| 2014/0334230 A1 | 11/2014 | Kwon |
| 2015/0060989 A1* | 3/2015 | Loiko ............... H01L 29/49 257/324 |
| 2015/0132953 A1* | 5/2015 | Nowling ............... H01L 21/32133 438/692 |
| 2016/0126206 A1* | 5/2016 | Viswanathan ......... H01L 23/3735 257/76 |
| 2018/0174994 A1* | 6/2018 | Choi ............... H01L 24/20 |

OTHER PUBLICATIONS

Korean Office Action; Application No. 10-2014-0176030; dated Aug. 24, 2016.
Chinese Office Action; Application No. 201410403876.0; dated Apr. 6, 2017.
German Office Action; Application No. 102014119174.9; dated Feb. 23, 2017.
Office Action issued in Chinese Patent Application No. 201410403876.0, dated Dec. 22, 2017.
Singanamalla, R., et al., "Effective Work function Modulation by As Implantation in Metal Gate Stacks", The Electrochemical Society, ECS Transactions, 2(1) 49-60 (2006).
Fet, A., "Flurine implantation for effective work function control in p-type metal-oxide-semiconductor high-k metal gate stacks", American Vacuum Society, J. Vac. Sci. Technol. B 29(1), Jan./Feb. 2011.
Chen Y.W., "Effective Work Function Modulation by Aluminum Ion Implantation on Hf-Based High-k/Metal Gate pMOSFET", IEEE Electron Device Letters, vol. 31, No. 11, Nov. 2010.
Non-final Office Action issued in related U.S. Appl. No. 14/148,825, dated Mar. 10, 2015.
Final Office Action issued in related U.S. Appl. No. 14/148,825, dated Oct. 7, 2015.
Non-final Office Action issued in related U.S. Appl. No. 14/148,825, dated Aug. 9, 2016.
Final Office Action issued in related U.S. Appl. No. 14/148,825, dated Nov. 29, 2016.
Non-final Office Action issued in related U.S. Appl. No. 14/148,825, dated May 16, 2017.
Final Office Action issued in related U.S. Appl. No. 14/148,825, dated Oct. 12, 2017.
Non-final Office Action issued in related U.S. Appl. No. 14/148,825, dated Mar. 19, 2018.
Final Office Action issued in related U.S. Appl. No. 14/148,825, dated Sep. 20, 2018.
Notice of Allowance issued in related U.S. Appl. No. 14/148,825, dated Dec. 13, 2018.

* cited by examiner

1300

1300

1300

1300

1300

1400

1400

SEMICONDUCTOR DEVICE WITH MULTIPLE THRESHOLD VOLTAGE AND METHOD OF FABRICATING THE SAME

RELATED APPLICATIONS

This application is a Continuation of application Ser. No. 14/148,825 filed Jan. 7, 2014, the entire contents of which is incorporated herein by reference.

FIELD

This disclosure relates generally to semiconductors, and, more particularly, to a semiconductor device with multiple threshold voltage and a method of fabricating the same.

BACKGROUND

In the advanced technology, integration of various functions into a single chip may shrink the dimension of the chip and enhance the performance. Since various functions require multiple thresholds, there is a need for a semiconductor device with multiple threshold voltages.

DETAILED DESCRIPTION

Reference will now be made in detail to exemplary embodiments, which are illustrated in the accompanying drawings. Wherever possible, the same reference numbers will be used throughout the drawings to refer to the same or like parts.

The disclosure describes a method which may utilize a forming process and an implanting process to fabricate vertical devices having multiple thresholds and is suitable for different functions. The forming process may refer to deposition processes, photolithography processes, etching processes or the combination thereof.

Figure 1:
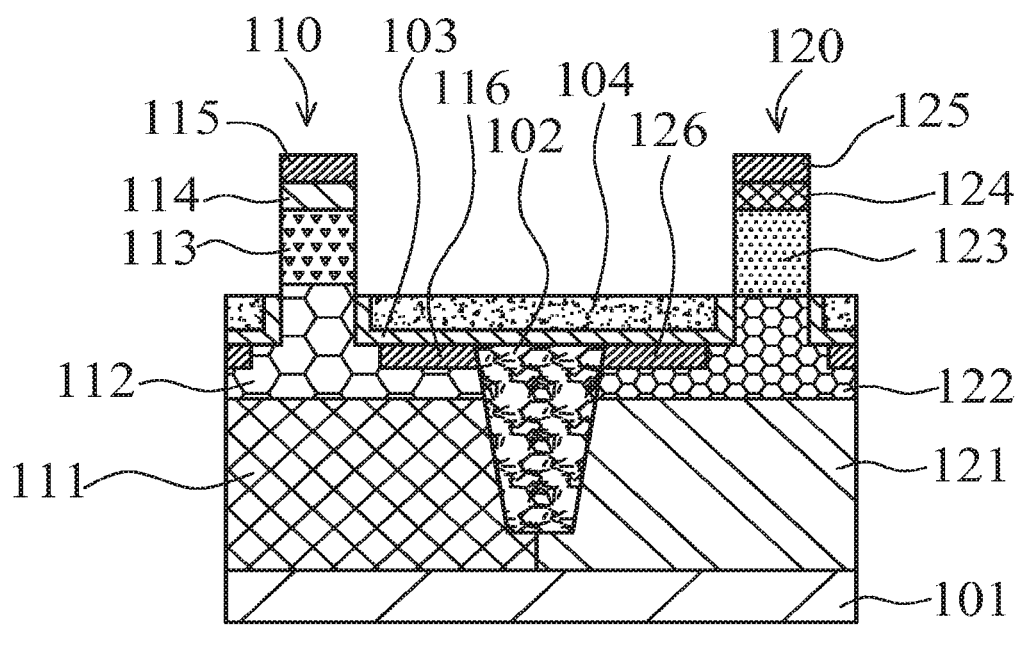
FIG. 1 is a sectional view illustrating an exemplary semiconductor device according to an exemplary embodiment.

FIG. 1 is a sectional view illustrating an exemplary semiconductor device according to an exemplary embodiment. As shown in FIG. 1, a chip 100 is provided. In the chip 100, a first vertical device 110 having a first threshold and a second vertical device 120 having a second threshold are provided over a substrate 101. The first vertical device 110 and the second vertical device 120 may be vertical-gate-all-around devices electrically isolated by a shallow trench isolation 102. The first vertical device 110 may be a PMOS, and may include an n-well 111, a first source 112, a first channel 113 and a first drain 114. The second vertical device 120 may be a NMOS, and may include a p-well 121, a second source 122, a second channel 123 and a second drain 124. Salicides 115, 116, 125, 126 are used to reduce contact resistance. The threshold may refer to the value of the gate-source voltage when the conducting channel just begins to connect the source and drain of the transistor, allowing significant current.

The first source 112 may be disposed over the n-well 111. The first channel 113 may be disposed over the first source 112. The first drain 114 may be disposed over the first channel 113. The second source 122 may be disposed over the p-well 121. The second channel 123 may be disposed over the second source 122. The second drain 124 may be disposed over the second channel 123. A silicon nitride layer 103 as an insulator may be disposed over the first source 112, the second source 122 and the shallow trench isolation 102. An oxide layer 104 may be disposed over the silicon nitride layer 103.

Figure 2:
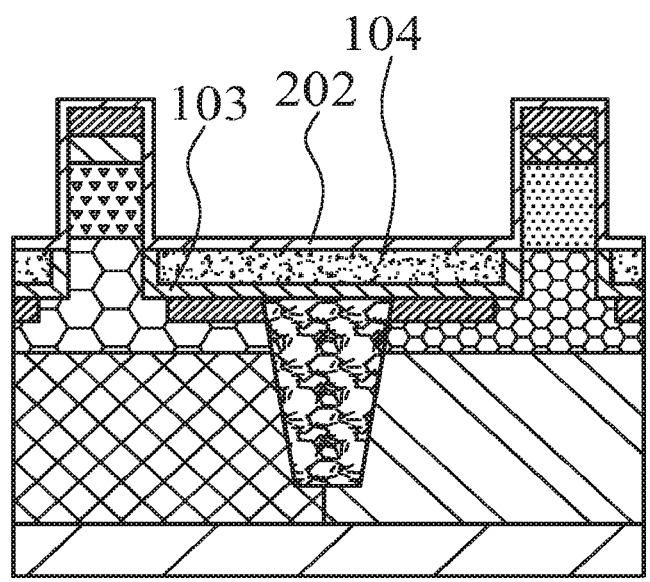
FIG. 2 is a sectional view illustrating the exemplary chip according to the exemplary embodiment.

FIG. 2 is a sectional view illustrating the exemplary chip according to the exemplary embodiment. As shown in FIG. 2, a high-k dielectric layer 202 may be formed over a portion of the silicon nitride layer 103 and the oxide layer 104. In another exemplary embodiment, an interfacial layer (not shown) may be formed over a portion of the silicon nitride layer 103 and the oxide layer 104. Then, the high-k dielectric layer 202 may be formed over the interfacial layer (not shown).

Figure 3:
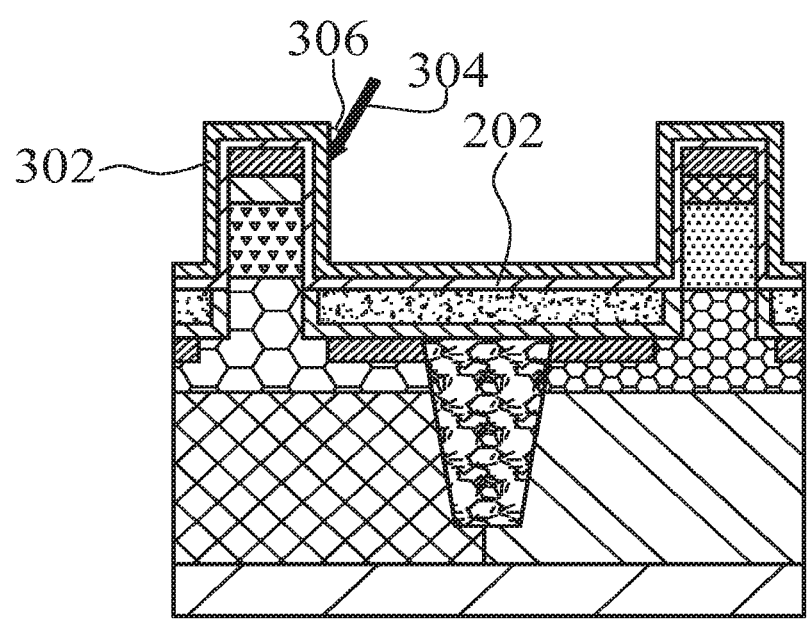
FIG. 3 is a sectional view illustrating the exemplary chip according to the exemplary embodiment.

FIG. 3 is a sectional view illustrating the exemplary chip according to the exemplary embodiment. As shown in FIG. 3, a first conductive layer 302 may be formed over the high-k dielectric layer 202 as a portion of a first gate electrode. The first conductive layer 302 may be formed of, for example, a p-type work function metal. The p-type work function metal may be formed of, for example, compounds of TiN, or TaN based material with Te, Re Rh, Be, or Co. The thickness of the p-type work function metal may be 5-100 angstrom.

In the exemplary embodiment, the first conductive layer 302 may be further implanted with a first dopant 304 at a tilted angle 306 with reference to vertical direction. In detail, the tilted angle 306 with reference to vertical direction for implantation may be about 5 to 60 degrees. The first dopant 304 may be formed of, for example, Al, Ga, In, Be, Se, or F. Typical implantation energies may be, for example, in the range of 100 eV to 25 keV. Efficient dosage may be, for example, in the range of $10^{13}$ ions/cm$^2$ to $10^{16}$ ions/cm$^2$.

Figure 4:
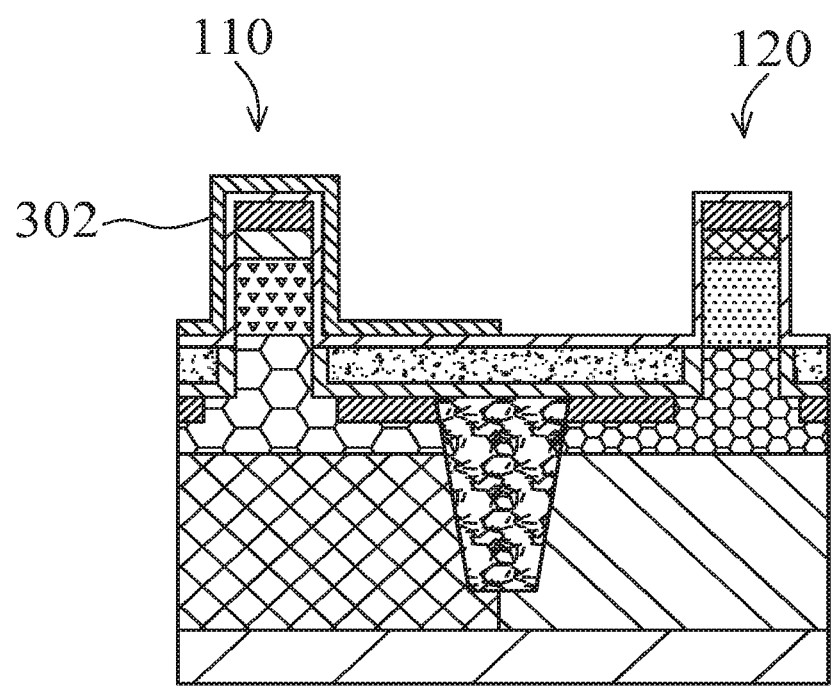
FIG. 4 is a sectional view illustrating the exemplary chip according to the exemplary embodiment.

FIG. 4 is a sectional view illustrating the exemplary chip according to the exemplary embodiment. As shown in FIG.

4, the portion of the first conductive layer 302 corresponding to the second vertical device 120 is removed, and the portion of the first conductive layer 302 corresponding to the first vertical device 110 remains.

Figure 5:
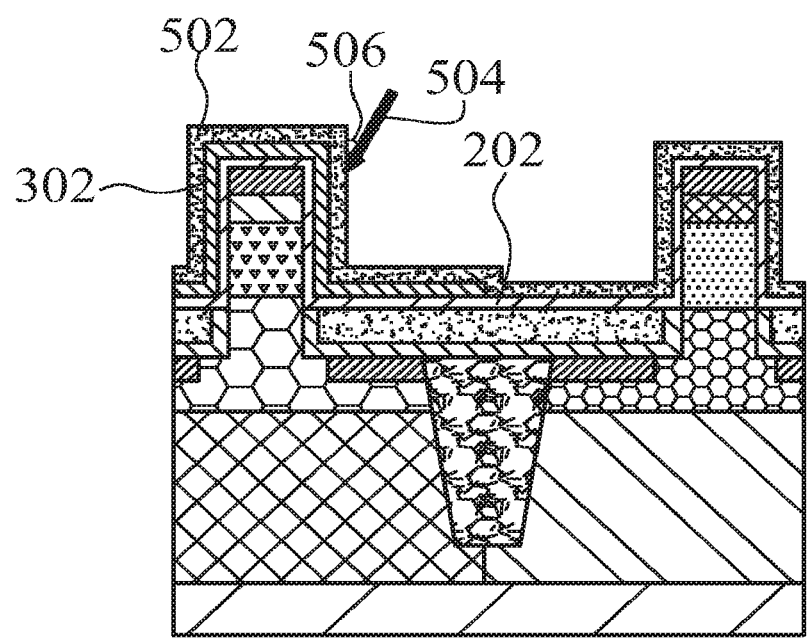
FIG. 5 is a sectional view illustrating the exemplary chip according to the exemplary embodiment.

FIG. 5 is a sectional view illustrating the exemplary chip according to the exemplary embodiment. As shown in FIG. 5, a second conductive layer 502 may be formed over the first conductive layer 302 and a portion of the high-k dielectric layer 202 as a portion of a second gate electrode. The second conductive layer 502 may be formed of, for example, an n-type work function metal. The n-type work function metal may be formed of, for example, compounds of TiN, TiAl, or TaN based material with Al, Mn, Zr, Pb, or Sn. The thickness of the n-type work function metal may be 5-300 angstrom. In another exemplary embodiment, a third conductive layer may be formed over the second conductive layer 502. The lateral surface of the channel 113 of the first vertical device 110.

In the exemplary embodiment, the second conductive layer 502 may be further implanted with a second dopant 504 at a tilted angle 506 with reference to vertical direction. In detail, the tilted angle 506 with reference to vertical direction for implantation may be about 5 to 60 degrees. The second dopant 504 may be formed of, for example, As, Sb, P, Ta, Te, Sn, S, Mo, Cs, or Ge. Typical implantation energies may be, for example, in the range of 100 eV to 25 keV. Efficient dosage may be, for example, in the range of $10^{13}$ ions/cm$^2$ to $10^{16}$ ions/cm$^2$.

Figure 6:
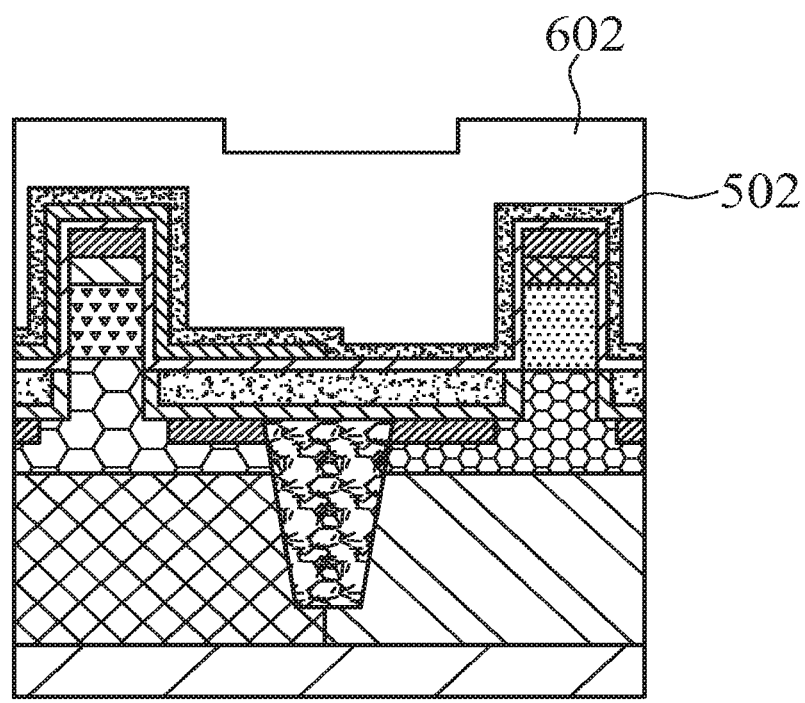
FIG. 6 is a sectional view illustrating the exemplary chip according to the exemplary embodiment.

FIG. 6 is a sectional view illustrating the exemplary chip according to the exemplary embodiment. As shown in FIG. 6, a gate layer 602 may be formed over the second conductive layer 502 by deposition. The gate layer 602 may be formed of, for example, Al, W, Co or Cu.

Figure 7:
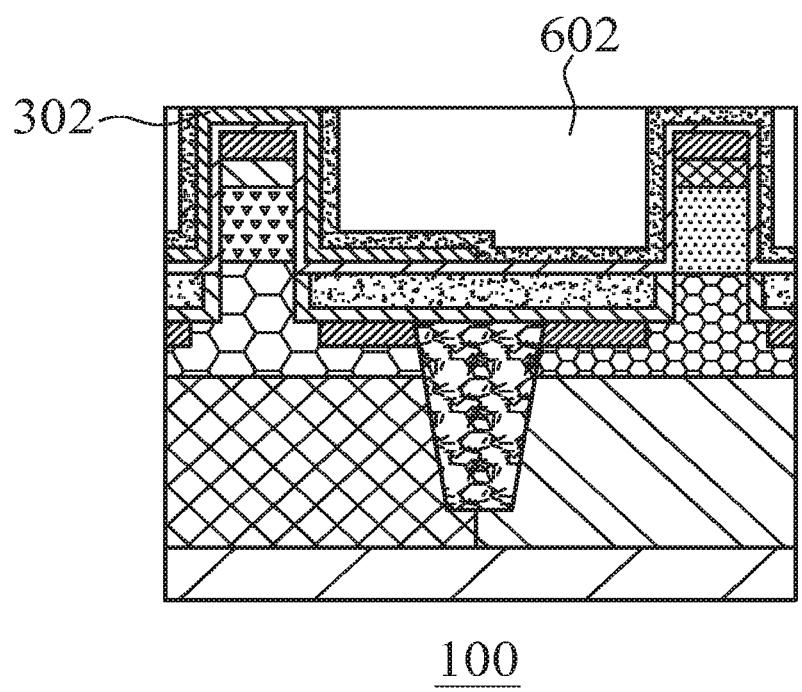
FIG. 7 is a sectional view illustrating the exemplary chip according to the exemplary embodiment.

FIG. 7 is a sectional view illustrating the exemplary chip according to the exemplary embodiment. As shown in FIG. 7, a chemical mechanical polishing is performed on the gate layer 602 and stops on the first conductive layer 302.

Figure 8:
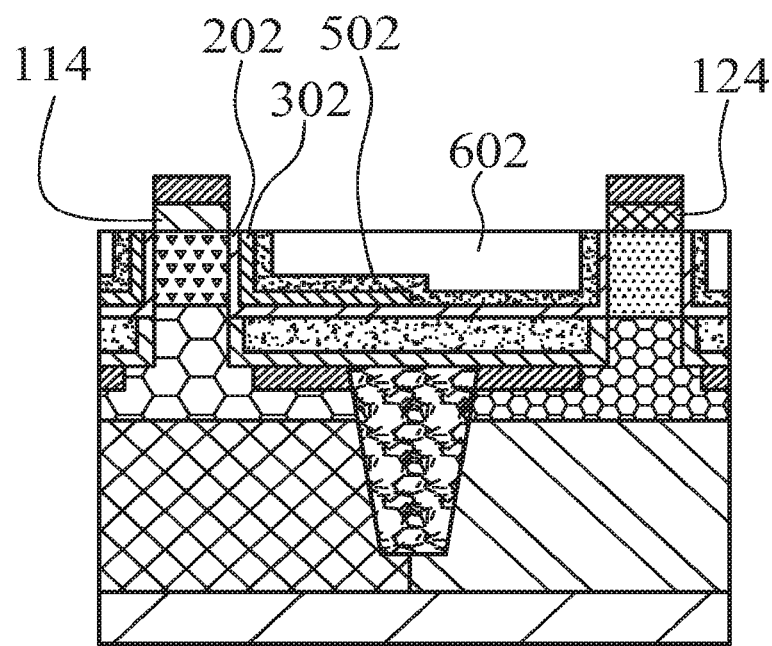
FIG. 8 is a sectional view illustrating the exemplary chip according to the exemplary embodiment.

FIG. 8 is a sectional view illustrating the exemplary chip according to the exemplary embodiment. As shown in FIG. 8, a dry etch back process is performed on the gate layer 602, high-k dielectric layer 202, the first conductive layer 302 and the second conductive layer 502 to expose the first drain 114 and the second drain 124.

Figure 9:
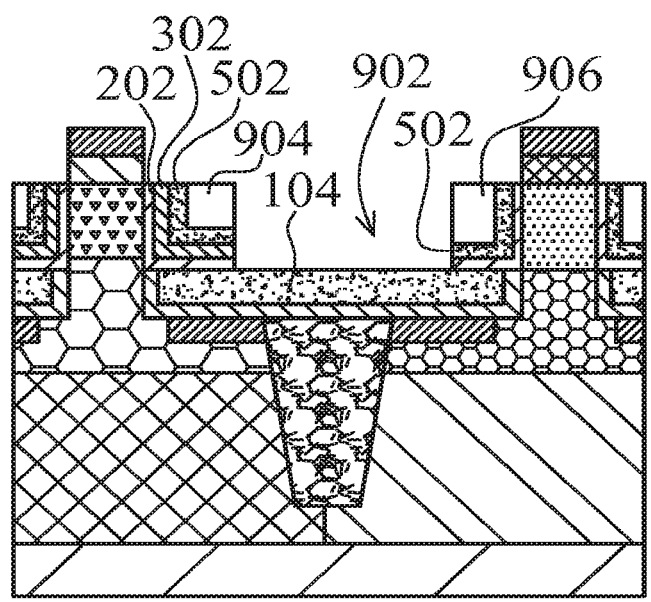
FIG. 9 is a sectional view illustrating the exemplary chip according to the exemplary embodiment.

FIG. 9 is a sectional view illustrating the exemplary chip according to the exemplary embodiment. As shown in FIG. 9, a dry etch back process is performed on the gate layer (not shown), high-k dielectric layer 202, the first conductive layer 302 and the second conductive layer 502 to expose a portion of the oxide layer 104 and to form a gap 902. A first gate metal 904 is formed adjacent to the first conductive layer 302 and the second conductive layer 502, and a second gate metal 906 is formed adjacent to the second conductive layer 502.

Figure 10:
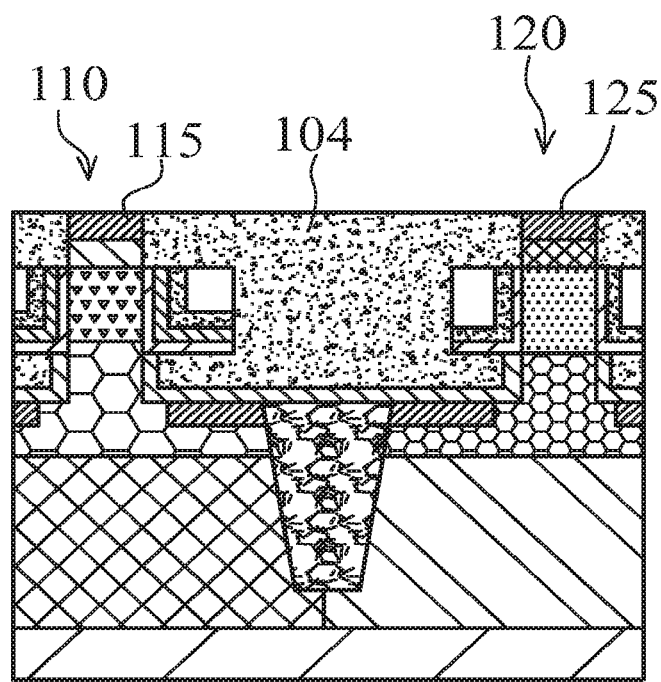
FIG. 10 is a sectional view illustrating the exemplary chip according to the exemplary embodiment.

FIG. 10 is a sectional view illustrating the exemplary chip according to the exemplary embodiment. As shown in FIG. 10, the oxide layer 104 may be re-formed over the first vertical device 110 and the second vertical device 120. And a chemical mechanical polishing is performed on the oxide layer 104 and stops on the salicides 115, 125.

As such, in the chip 100, the first vertical device 110 having the first threshold and the second vertical device 120 having the second threshold are formed. The first conductive layer 302 and the second conductive layer 502 of the first vertical device 110 corresponds to the first threshold, and the second conductive layer 502 of the second vertical device 120 corresponds to the second threshold.

Figure 11:
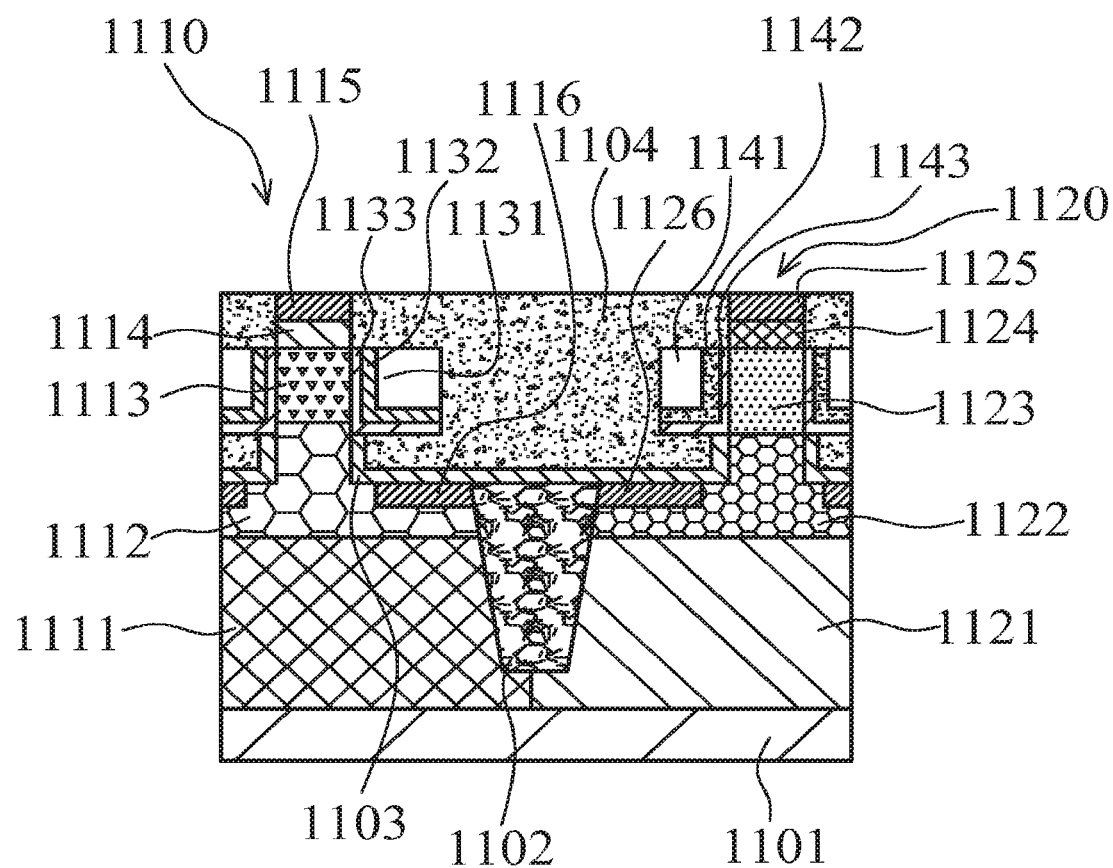
FIG. 11 is a sectional view illustrating an exemplary semiconductor device according to an exemplary embodiment.

FIG. 11 is a sectional view illustrating an exemplary semiconductor device according to an exemplary embodiment. As shown in FIG. 11, a chip 1100 is provided. In the chip 1100, a first vertical device 1110 having a first threshold and a second vertical device 1120 having a second threshold are provided over a substrate 1101. The first vertical device 1110 and the second vertical device 1120 may be electrically isolated by a shallow trench isolation 1102. The first vertical device 1110 may be a PMOS, and may include a n-well 1111, a first source 1112, a first channel 1113, a first drain 1114, a first gate metal 1131, a first conductive layer 1132 and a first high-k dielectric layer 1133. The second vertical device 1120 may be a NMOS and may include a p-well 1121, a second source 1122, a second channel 1123, a second drain 1124, a second gate metal 1141, a second conductive layer 1142 and a second high-k dielectric layer 1143. Salicides 1115, 1116, 1125, 1126 are used to reduce contact resistance. The threshold may refer to the value of the gate-source voltage when the conducting channel just begins to connect the source and drain of the transistor, allowing significant current.

The first source 1112 may be disposed over the n-well 1111. The first channel 1113 may be disposed over the first source 1112. The first drain 1114 may be disposed over the first channel 1113. The second source 1122 may be disposed over the p-well 1121. The second channel 1123 may be disposed over the second source 1122. The second drain 1124 may be disposed over the second channel 1123. A silicon nitride layer 1103 as an insulator may be disposed over the first source 1112, the second source 1122 and the shallow trench isolation 1102. An oxide layer 1104 may be disposed over the silicon nitride layer 1103.

The first conductive layer 1132 is disposed adjacent to the first channel 1113, and the second conductive layer 1142 is disposed adjacent to the second channel 1123. The first high-k dielectric layer 1133 may be disposed between the first conductive layer 1132 and the first channel 1113, and the second high-k dielectric layer 1143 may be disposed between the second conductive layer 1142 and the second channel 1123. The first gate metal 1131 is disposed adjacent to the first conductive layer 1132, and the second gate metal 1141 is disposed adjacent to the second conductive layer 1142.

In an exemplary embodiment, the first conductive layer 1132 and the second conductive layer 1142 may be formed of a first material, the first conductive layer 1132 is implanted with a first dopant, and the second conductive layer 1142 is implanted with a second dopant. The first dopant may be formed of, for example, Al, Ga, In, Be, Se, or F. The second dopant may be formed of, for example, As, Sb, P, Ta, Te, Sn, S, Mo, Cs, or Ge. Typical implantation energies may be, for example, in the range of 100 eV to 25 keV. Efficient dosage may be, for example, in the range of $10^{13}$ ions/cm$^2$ to $10^{16}$ ions/cm$^2$.

In an exemplary embodiment, the first conductive layer 1132 and the second conductive layer 1142 may be formed of a first material, the first conductive layer 1132 is implanted with a first dopant with a first concentration, and the second conductive layer 1142 is implanted with the first dopant with a second concentration. In an exemplary embodiment, the first conductive layer 1132 and the second conductive layer 1142 may be formed of a first material, the first conductive layer has a first thickness, and the second conductive layer has a second thickness. In an exemplary embodiment, the first conductive layer 1132 is formed of a first material having a first work function, and the second conductive layer 1142 is formed of a second material having a second work function. In the above exemplary embodiments, the first conductive layer 1132 corresponds to the first threshold, and the second conductive layer 1142 corresponds to the second threshold.

In another exemplary embodiment, the first vertical device may further include a third conductive layer (not shown) between the first gate metal 1131 and the first conductive layer 1132. The first conductive layer and the third conductive layer correspond to the first threshold, and the second conductive layer corresponds to the second threshold.

Figure 12:
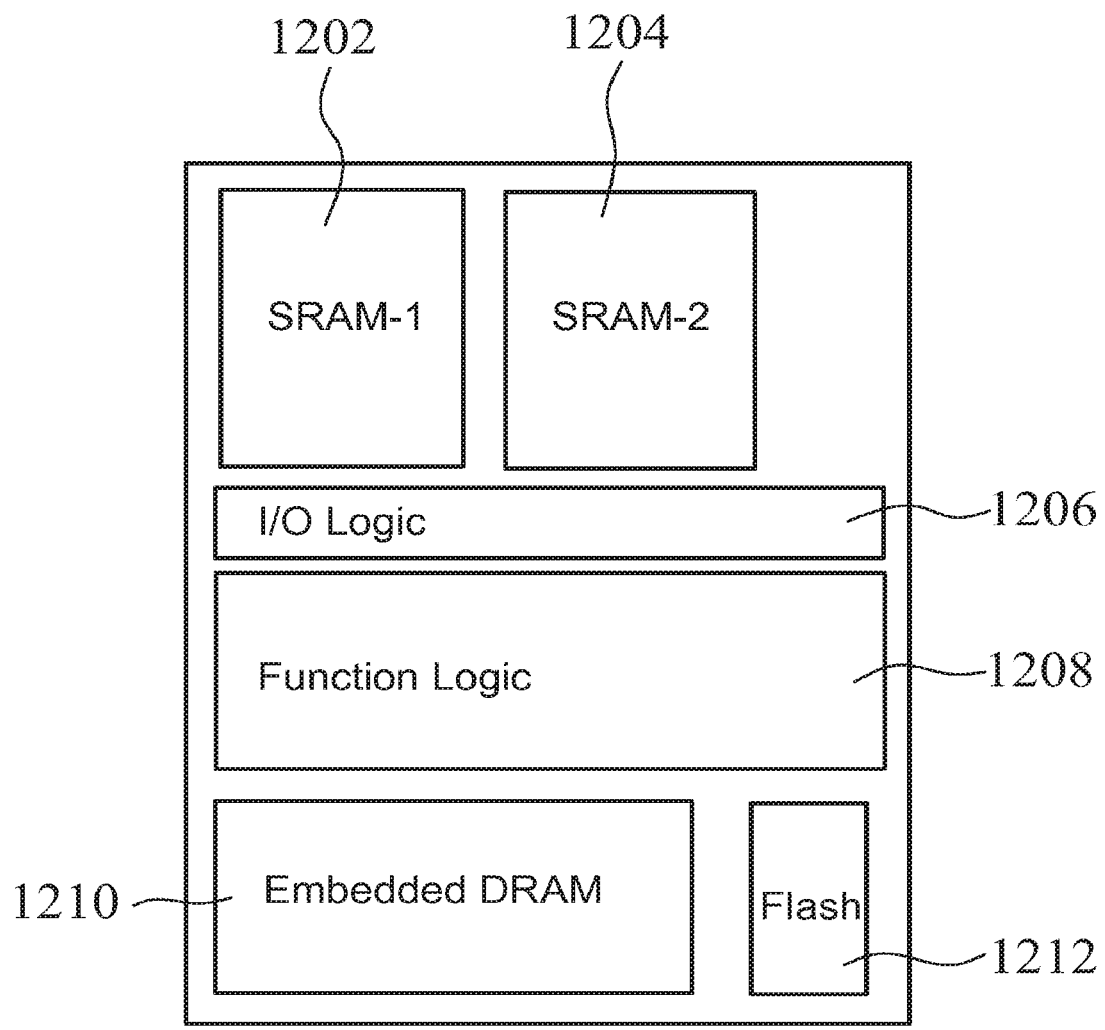
FIG. 12 is a block diagram illustrating an exemplary chip according to an exemplary embodiment.

FIG. 12 is a block diagram illustrating an exemplary chip according to an exemplary embodiment. As shown in FIG. 12, a chip 1200 is provided. The chip 1200 includes a first SRAM block 1202, a second SRAM block 1204, an I/O logic block 1206, a function logic block 1208, an embedded DRAM block 1210 and a flash block 1212. Said first vertical device and said second vertical device in the disclosure may be used for at least one of the blocks 1202-1212.

FIGS. 13*a*-13*h* are block diagrams illustrating an exemplary chip according to an exemplary embodiment. A chip 1300 is provided. Transistors 1301-1306 are vertical devices to be manufactured to have six different thresholds. For example, the transistors 1301-1303 are respectively NFETs having a low threshold, a medium threshold and a high threshold. For example, 1304-1306 are respectively PFETs having a low threshold, a medium threshold and a high threshold.

Figure 13A:
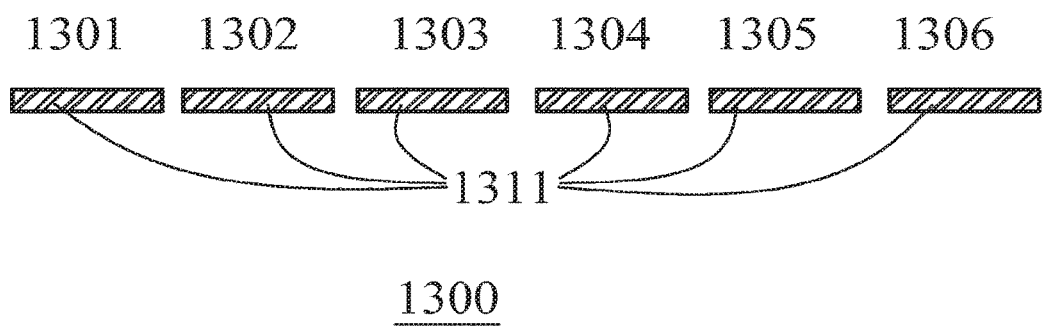
FIGS. 13*a*-13*h* are block diagrams illustrating an exemplary chip according to an exemplary embodiment.
Figure 13B:
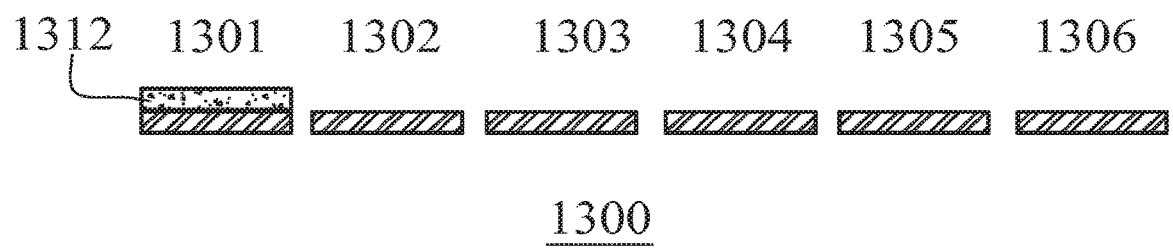
Figure 13C:
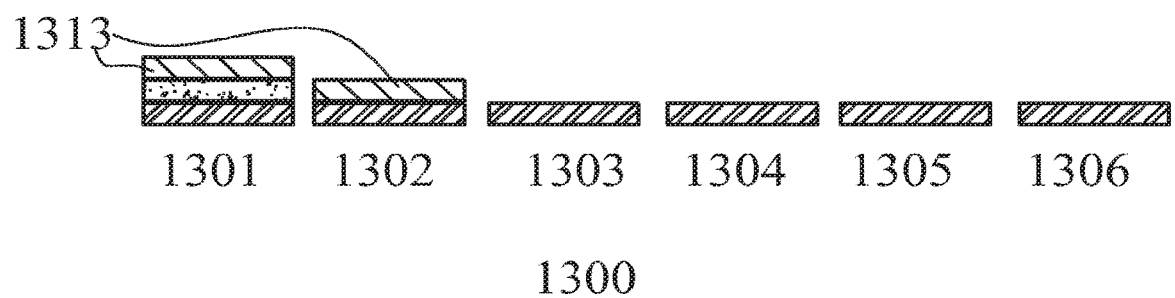
Figure 13D:
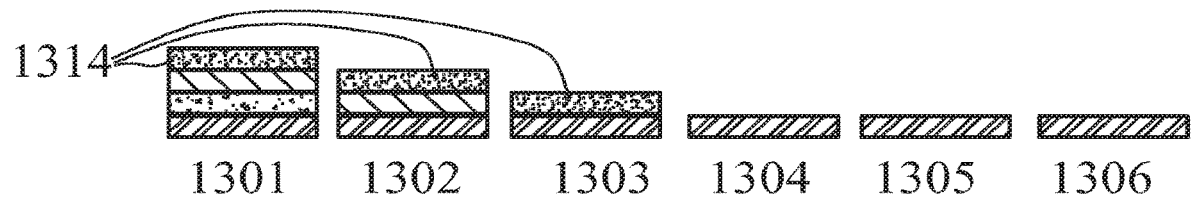
Figure 13E:
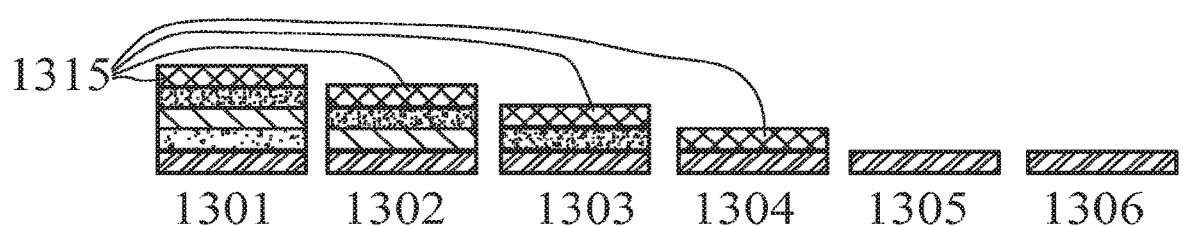
Figure 13F:
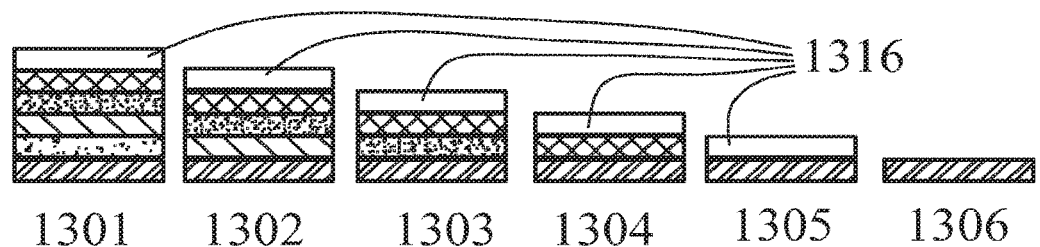
Figure 13G:
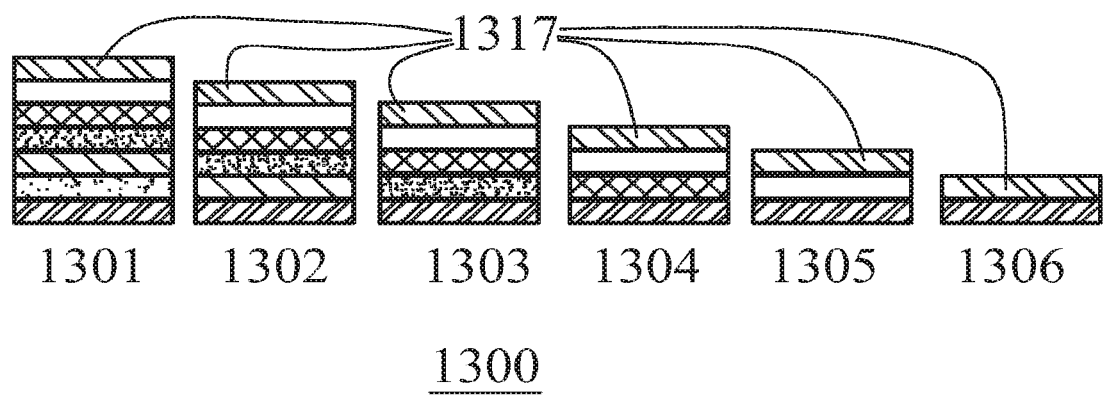
Figure 13H:
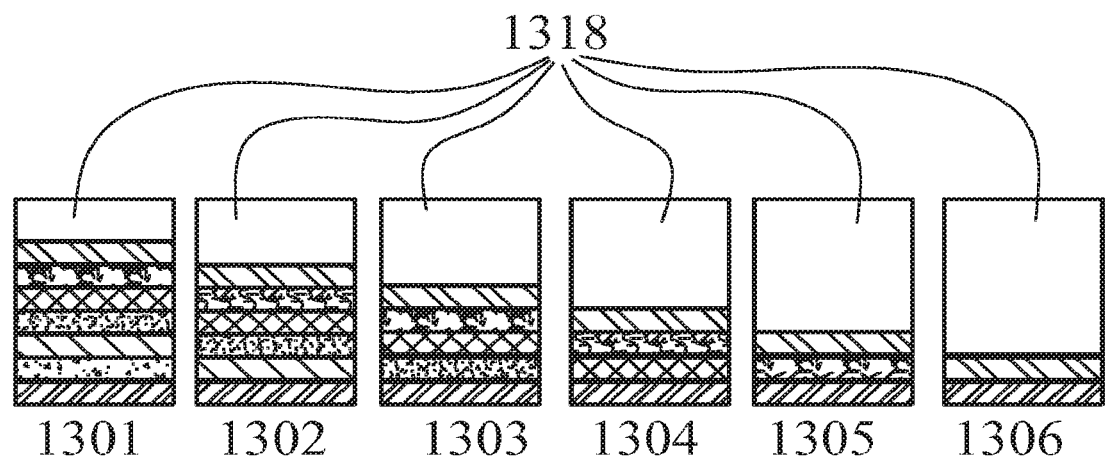

In FIG. 13*a*, for the transistors 1301-1306, a first p-type metal layer 1311 is formed over a channel layer (not shown). In FIG. 13*b*, for the transistor 1301, a first n-type metal layer 1312 is formed. In FIG. 13*c*, for the transistors 1301-1302, a second n-type metal layer 1313 is formed. In FIG. 13*d*, for the transistors 1301-1303, a third n-type metal layer 1314 is formed. In FIG. 13*e*, for the transistors 1301-1304, a second p-type metal layer 1315 is formed. In FIG. 13*f*, for the transistors 1301-1305, a third p-type metal layer 1316 is formed. In FIG. 13*g*, for the transistors 1301-1306, a cap metal layer 1316 is formed. In FIG. 13*h*, for the transistors 1301-1306, a gate metal layer 1318 is formed. As such, the transistors 1301-1306 having six different thresholds are provided.

FIGS. 14*a*-14*h* are block diagrams illustrating an exemplary chip according to an exemplary embodiment. A chip 1400 is provided. Transistors 1401-1406 are vertical devices to be manufactured to have six different thresholds. For example, the transistors 1401-1403 are respectively NFETs having a low threshold, a medium threshold and a high threshold. For example, 1404-1406 are respectively PFETs having a low threshold, a medium threshold and a high threshold.

Figure 14A:
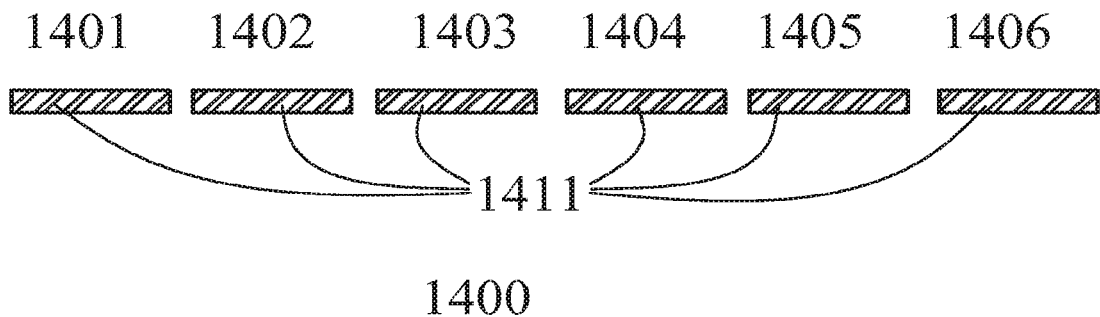
FIGS. 14*a*-14*h* are block diagrams illustrating an exemplary chip according to an exemplary embodiment.
Figure 14B:
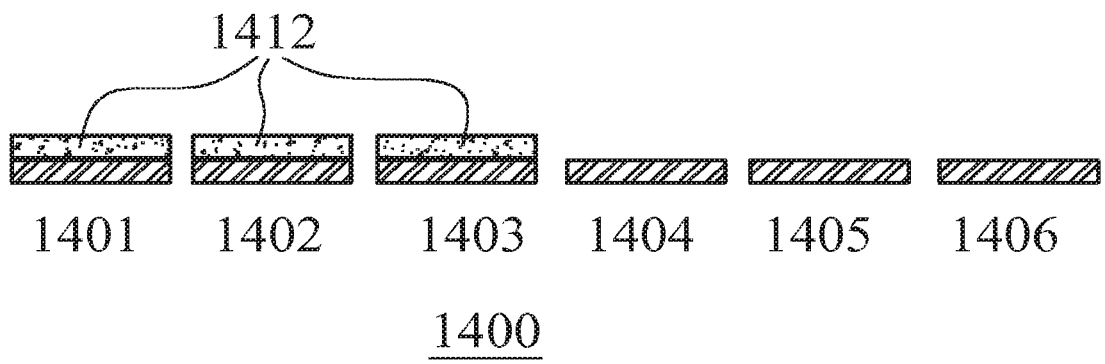
Figure 14C:
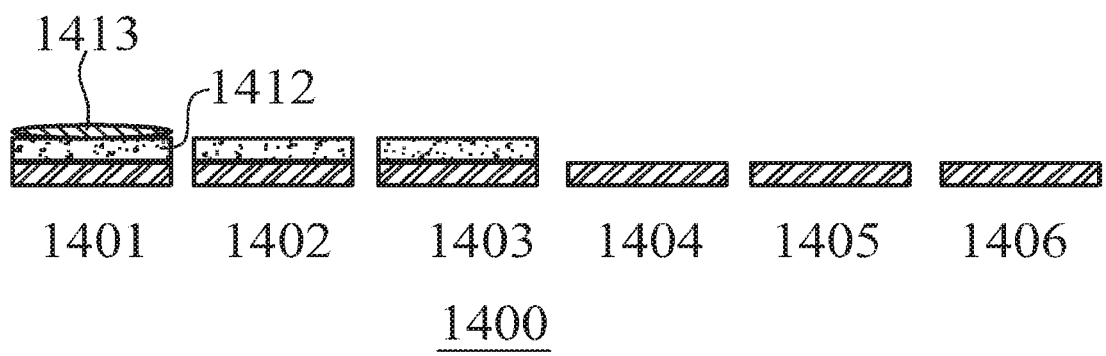
Figure 14D:
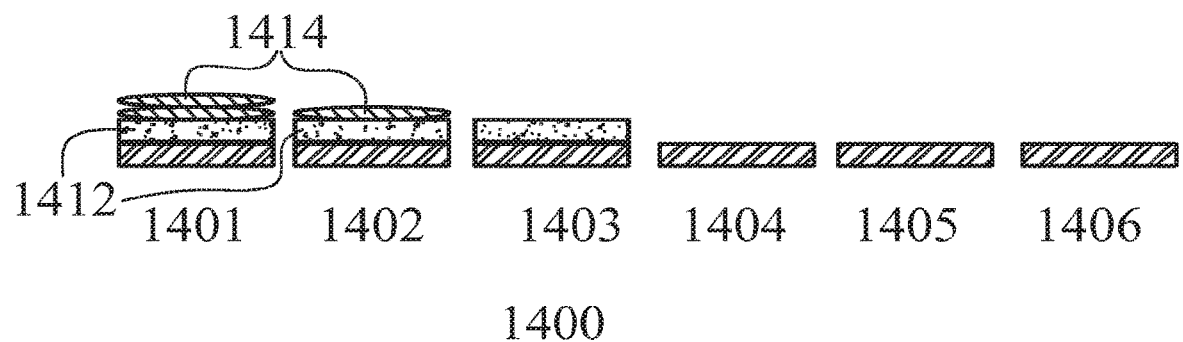
Figure 14E:
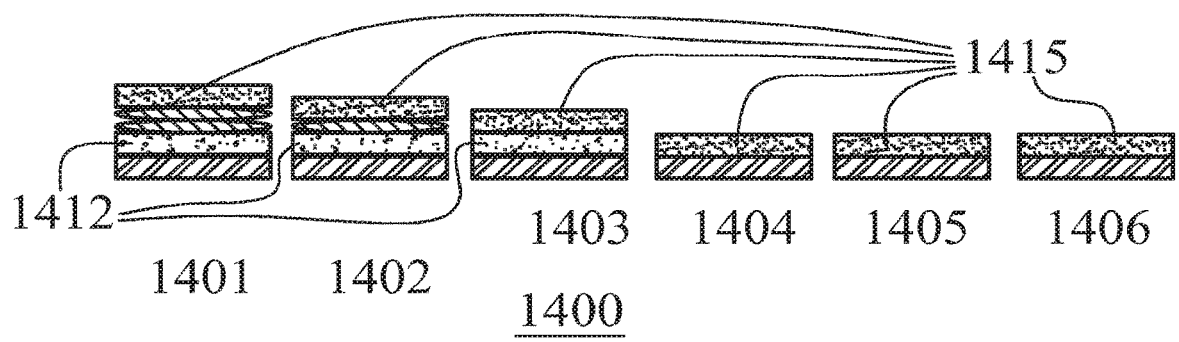
Figure 14F:
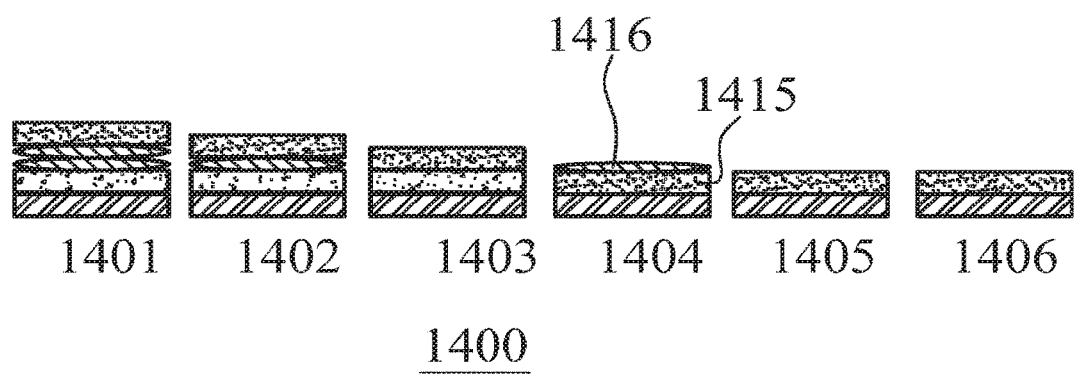
Figure 14G:
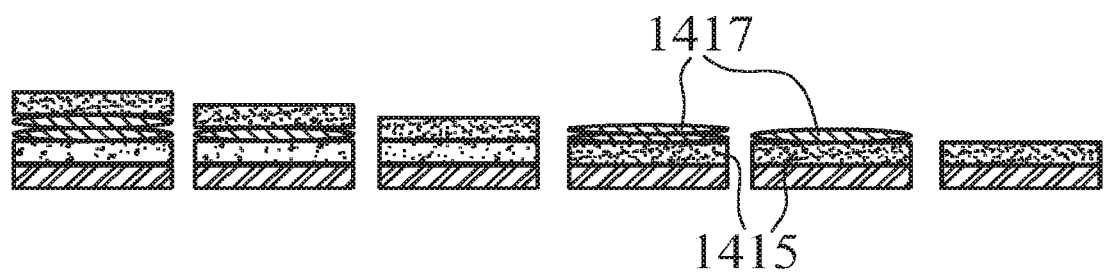
Figure 14H:
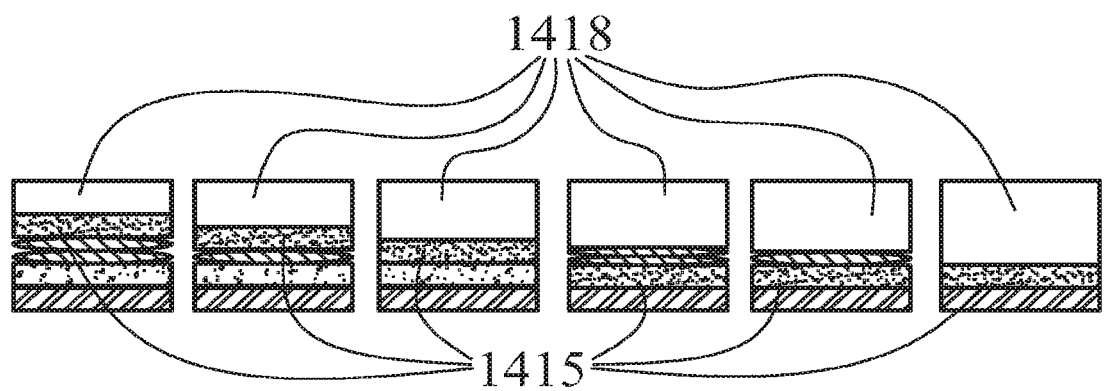

In FIG. 14*a*, for the transistors 1401-1406, a first p-type metal layer 1411 is formed over a channel layer (not shown). In FIG. 14*b*, for the transistor 1401-1403, a first n-type metal layer 1412 is formed. In FIG. 14*c*, for the transistor 1401, a first dopant 1413 is implanted in the first n-type metal layer 1412. In FIG. 14*d*, for the transistors 1401-1402, a second dopant 1414 is implanted in the first n-type metal layer 1412. In FIG. 14*e*, for the transistors 1401-1406, a cap metal layer 1415 is formed. In FIG. 14*f*, for the transistor 1404, a third dopant 1416 is implanted in the cap metal layer 1415. In FIG. 14*g*, for the transistors 1404-1405, a fourth dopant 1417 is implanted in the cap metal layer 1415. In FIG. 14*h*, for the transistors 1401-1406, a gate metal layer 1418 is formed over the cap metal layer 1415. As such, the transistors 1401-1406 having six different thresholds are provided.

Figure 15:
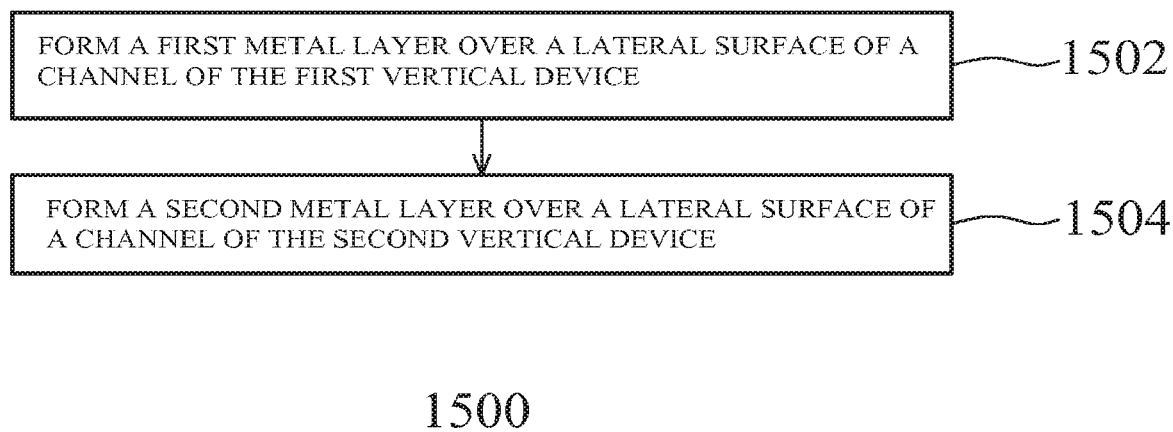
FIG. 15 is a flow chart for manufacturing a chip comprising a first vertical device having a first threshold and a second vertical device having a second threshold according to an exemplary embodiment.

FIG. 15 is a flow chart for manufacturing a chip comprising a first vertical device having a first threshold and a second vertical device having a second threshold according to an exemplary embodiment. As shown in FIG. 15, a method 1500 is provided. The method 1500 includes the following operations: forming a first conductive layer over a lateral surface of a channel of the first vertical device (1502); and forming a second conductive layer over a lateral surface of a channel of the second vertical device (1504).

In the exemplary embodiment, the method 1500 may include: implanting a first dopant at a tilted angle with reference to vertical direction. In the exemplary embodiment, the method 1500 may include: forming a first gate adjacent to the first conductive layer, and forming a second gate adjacent to the second conductive layer. In the exemplary embodiment, the method 1500 may include: forming a third conductive layer over the lateral surface of the channel of the first vertical device.

In the exemplary embodiment, the operation 1502 of forming the first conductive layer over the lateral surface of the channel of the first vertical device further comprises: forming the first conductive layer corresponding to the first threshold, and the operation 1504 of forming the second conductive layer over the lateral surface of the channel of the second vertical device further comprises: forming the second conductive layer corresponding to the second threshold. In the exemplary embodiment, the operation of implanting the first dopant at the tilted angle with the reference of the vertical direction further comprises: implanting the first dopant with 5 to 60 degrees with reference to vertical direction. In the exemplary embodiment, the operation of forming the first conductive layer and the third conductive layer over the lateral surface of the channel of the first vertical device further comprises: forming the first conductive layer and the third conductive layer corresponding to the first threshold, and forming the second conductive layer over the lateral surface of the channel of the second vertical device further comprises: forming the second conductive layer corresponding to the second threshold.

According to an exemplary embodiment, a chip is provided. The chip includes a first vertical device having a first threshold and second vertical device having a second threshold. The first vertical includes: a first source; a first channel over the first source; a first drain over the first channel; a first gate dielectric adjacent to the first channel; a first conductive layer adjacent to the first gate dielectric; and a first gate metal adjacent to the first conductive layer. The second vertical includes: a second source; a second channel over the second source; a second drain over the second channel; a second gate dielectric adjacent to the second channel; a second conductive layer adjacent to the second gate dielectric; and a second gate metal adjacent to the second conductive layer.

According to an exemplary embodiment, a method for manufacturing a chip comprising a first vertical device having a first threshold and a second vertical device having a second threshold is provided. The method includes the following operations: forming a first conductive layer over a lateral surface of a channel of the first vertical device; and forming a second conductive layer over a lateral surface of a channel of the second vertical device.

According to an exemplary embodiment, a chip is provided. The chip includes a first vertical device having a first threshold, second vertical device having a second threshold and a third vertical device having a third threshold. The first vertical includes: a first source; a first channel over the first source; a first drain over the first channel; a first gate dielectric adjacent to the first channel; a first conductive layer adjacent to the first gate dielectric; and a first gate metal adjacent to the first conductive layer. The second vertical includes: a second source; a second channel over the second source; a second drain over the second channel; a second gate dielectric adjacent to the second channel; a second conductive layer adjacent to the second gate dielectric; and a second gate metal adjacent to the second conductive layer. The third vertical device having a third threshold includes: a third source; a third channel over the third source; a third drain over the third channel; a third gate dielectric adjacent to the third channel; a third conductive layer adjacent to the third gate dielectric; and a third gate metal adjacent to the third conductive layer.

In the exemplary embodiment, the first conductive layer corresponds to the first threshold, the second conductive layer corresponds to the second threshold, and the third conductive layer corresponds to the third threshold.

This written description uses examples in the disclosure to: disclose the best mode and also to enable a person ordinarily skilled in the art to make and use the disclosure. The patentable scope may include other examples that occur to those skilled in the art.

One skilled in the relevant art upon reading this disclosure will recognize that the various embodiments may be practiced without one or more of the specific details, or with other replacement and/or additional methods, materials, or components. Well-known structures, materials, or operations may not be shown or described in detail to avoid obscuring aspects of various embodiments. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein may be manufactured, used, or shipped in a number of positions and orientations. Persons skilled in the art will recognize various equivalent combinations and substitutions for various components shown in the figures.

What is claimed is:

1. A vertical semiconductor field effect transistor (FET), comprising:
   a source;
   a channel over the source;
   a drain over the channel;
   a gate dielectric layer adjacent to a lateral surface of the channel;
   a first conductive layer adjacent to the gate dielectric layer; and
   a gate metal layer adjacent to the first conductive layer, wherein the first conductive layer includes TiN or TaN, which further comprises Te.

2. The vertical semiconductor FET of claim 1, wherein the first conductive layer is implanted with a first dopant.

3. The vertical semiconductor FET of claim 2, wherein the first dopant is selected from the group consisting of Al, Ga, In, Be, Se and F.

4. The vertical semiconductor FET of claim 1, wherein a thickness of the p-type work function metal layer is in a range from 0.5 nm to 10 nm.

5. The vertical semiconductor FET of claim 1, wherein the gate metal layer includes W, Co, or Cu.

6. The vertical semiconductor FET of claim 5, further comprising a second conductive layer between the first conductive layer and the gate metal layer.

7. The vertical semiconductor FET of claim 6, wherein the second conductive layer includes TiN, TiAl, or TaN.

8. The vertical semiconductor FET of claim 7, wherein the second conductive layer further comprises Mn, Zr, Pb, or Sn.

9. The vertical semiconductor FET of claim 8, wherein the second conductive layer is implanted with a second dopant.

10. The vertical semiconductor FET of claim 9, wherein the second dopant is selected from the group consisting of As, Sb, P, Ta, Te, Sn, S, Mo, Sc, and Ge.

11. A vertical semiconductor field effect transistor (FET), comprising:
    a source;
    a channel over the source;
    a drain over the channel;
    a gate dielectric layer adjacent to a lateral surface of the channel;
    a conductive layer adjacent to the gate dielectric layer; and
    a gate metal layer adjacent to the conductive layer, wherein the conductive layer includes TiN, TiAl, or TaN, which further comprises Mn, or Sn.

12. The vertical semiconductor FET of claim 11, wherein the conductive layer is implanted with a dopant.

13. The vertical semiconductor FET of claim 12, wherein the dopant is selected from the group consisting of As, Sb, P, Ta, Te, Sn, S, Mo, Sc, and Ge.

14. The vertical semiconductor FET of claim 11, wherein the conductive layer in in direct contact with the gate dielectric layer and the gate metal layer.

15. A semiconductor device, comprising a first vertical device, a second vertical device, a third vertical device, a fourth vertical device, a fifth vertical device and a sixth vertical device, wherein:

each of the first, second, third, fourth, fifth and sixth vertical devices includes:
- a source;
- a channel over the source;
- a drain over the channel;
- a gate dielectric layer adjacent to a lateral surface of the channel;
- a work function adjustment layer adjacent to the gate dielectric layer; and
- a gate metal layer adjacent to the work function adjustment layer, the work function adjustment layer of the first vertical device includes one conductive layer,
the work function adjustment layer of the second vertical device includes two conductive layers,
the work function adjustment layer of the third vertical device includes three conductive layers,
the work function adjustment layer of the first vertical device includes four conductive layers,
the work function adjustment layer of the first vertical device includes five conductive layers, and
the work function adjustment layer of the first vertical device includes six conductive layers.

16. The semiconductor device of claim 15, wherein:
the first to third vertical devices are p-type field effect transistors (FETs), and
the fourth to sixth vertical devices are n-type FETs.

17. The semiconductor device of claim 16, wherein the work function adjustment layer of at least one of the fourth to sixth vertical devices includes TiN, TiAl, or TaN, which further comprises Mn, Zr, Pb, or Sn.

18. The semiconductor device of claim 16, wherein the work function adjustment layer of at least one of the first to third vertical devices includes TiN or TaN, which further comprises Te, Re, Rh, Be, or Co.

19. The semiconductor device of claim 16, wherein each of the first, second, third, fourth, fifth and sixth vertical devices further includes a layer of TiN or TaN between the gate dielectric layer and the work function adjustment layer.

20. The semiconductor device of claim 19, wherein the work function adjustment layer of the first vertical device is in direct contact with the gate metal layer and the layer of TiN or TaN.

* * * * *